United States Patent [19]

Vancho et al.

[11] Patent Number: 5,346,747
[45] Date of Patent: Sep. 13, 1994

[54] COMPOSITE PRINTED CIRCUIT BOARD SUBSTRATE AND PROCESS FOR ITS MANUFACTURE

[75] Inventors: Vincent M. Vancho; Hak H. Wu; Yutao Ma; Erik L. Jorgensen, all of Tucson, Ariz.

[73] Assignee: Granmont, Inc., Tucson, Ariz.

[21] Appl. No.: 996,651

[22] Filed: Dec. 24, 1992

[51] Int. Cl.$^5$ ............................................... B32B 9/00
[52] U.S. Cl. .................................... 428/209; 428/901; 428/1; 528/191; 361/760
[58] Field of Search ........................... 428/209, 901, 1; 528/191; 361/400

[56] References Cited

U.S. PATENT DOCUMENTS

| | | | |
|---|---|---|---|
| 4,876,120 | 10/1989 | Belke et al. | 428/1 |
| 5,013,819 | 5/1991 | Coassolo et al. | 528/193 |
| 5,079,673 | 1/1992 | Kodai et al. | 361/400 |

FOREIGN PATENT DOCUMENTS

| | | |
|---|---|---|
| 0209391 | 1/1987 | European Pat. Off. . |
| 0373871 | 6/1990 | European Pat. Off. . |
| 0381206A3 | 8/1990 | European Pat. Off. . |
| 2031132 | 12/1971 | Fed. Rep. of Germany . |
| 62-036892 | 2/1987 | Japan . |

OTHER PUBLICATIONS

P. E. Gibson et al., "Thermally bondable polyester fiber: the effect of calender temperature," *Tappi Journal*, vol. 70, No. 12, pp. 82–86 (Dec. 1987).

*Primary Examiner*—Patrick J. Ryan
*Assistant Examiner*—Kam F. Lee
*Attorney, Agent, or Firm*—Bryan Cave

[57] ABSTRACT

Composite printed circuit board substrates having fiber reinforcement in a polymer matrix are disclosed. The fibers may be thermotropic melt processable liquid crystal polymer fibers.

6 Claims, No Drawings

COMPOSITE PRINTED CIRCUIT BOARD SUBSTRATE AND PROCESS FOR ITS MANUFACTURE

FIELD OF THE INVENTION

The present invention relates to substrates for use in printed circuit boards ("PCB").

More particularly, it relates to substrates having fibre reinforcements integrated into polymer matrices.

According to another aspect, the present invention relates to printed wired/circuit boards having a substrate comprising a fibre reinforcement in a form of a nonwoven web embedded in a thermosetting resin.

Still a further aspect of the present invention is a process for producing a fibre reinforcement adapted to be used in composite printed wiring/circuit boards.

PRIOR ART

Reinforcing fibres are becoming more important in the field of printed circuit board, being present in amounts of 30–70% by weight of the composite and with the increasing demand for high performance and reliability of the printed wiring/circuit boards the importance and reliability of the fibres increases. The general requirements for the fibres used as a component of the substrate for printed circuit boards are a low dielectric constant, low dissipation factor, favourable CTE (coefficient of thermal expansion), good moisture and chemical resistance, high temperature integrity, adequate machinability in the laminate state and reasonable cost.

A high thermal stability is necessary in order to withstand the high thermal excursions in surface mount technology (SMT). A low CTE coupled with a high dimensional stability is particularly important in order to provide an accurate positioning of the electronic components in the automatized assembly of the PCB. Moreover a good adhesion between resin and fibres is necessary to avoid delamination during hole drilling and to provide a product which has high mechanical strength and durability.

In the existing field of substrates for printed circuit boards the main fibres used for reinforcing are glass and aramid fibres.

Glass fibres demonstrate a high dielectric constant when randomly produced, which leads to delays in signal transmission, and have a CTE which does not match with the electronic device such as the chip carrier and thus may cause joint failure and makes the relative positions of the circuit board hard to predict. Many of these disadvantages can be overcome by producing a woven structure. For instance in European Patent EP 373871 a woven mixture of the glass fibre and yarns selected from polyether ether ketone, polyether imide and polysulphone is produced which enables a low dielectric constant to be obtained. However in reality the woven structure gives rise to other problems such as it becomes too tough to mass produce as it is difficult to break and so the plates have to be produced separately thus increasing production costs.

The aramid fibres based PCB demonstrate good dielectric constant and CTE but have the disadvantage of being very hygroscopic, leading to internal failure of PCB and requires additional processing steps.

The use of lyotropic liquid crystal polymers in the formation of PCB is already known from U.S. Pat. No. 4,876,120. Lyotropic LCP fibres, which are solution spun fibres, are not melt processable.

SUMMARY OF THE INVENTION

According to the present invention, a new kind of reinforcement for PCB has been discovered, which does not present the drawbacks of the known PCB fibre reinforcements and which can be easily produced using a melt spinning technology. The composite printed circuit board substrate according to the present invention has a fibre reinforcement which comprises thermotropic melt processable liquid crystal polymer (LCP) fibres. The thermotropic melt processable liquid crystal polymer (LCP) fibres may be used for all the types of PCB's, that is, single sided, double sided, multilayers (MLB), flexible and rigid-flex.

DETAILED DESCRIPTION OF THE INVENTION

In the composite printed circuit board substrate according to the present invention, the thermotropic fibres are preferably made of a polyester type liquid crystal polymer comprising:
  a) units derived from at least one aromatic or cycloaliphatic dicarboxy acid, preferably terephthalic acid, and
  b) units derived from a mixture of at least two hydroquinones mono-substituted with aralkyl groups containing at least 7 carbons, preferably 2-(alpha phenyl isopropyl) hydroquinone and (1-phenyl ethyl) hydroquinone, their molar ratio being within the range of from 0.5 to 1.8.

Such preferred LCP, disclosed in detail in U.S. Pat. No. 5,013,819, which is hereby incorporated herein by reference for all purposes, will be referred to in the following as GRANLAR B. Other thermotropic LCP's which can be used in the present invention as fibre reinforcement include those known as XYDAR ® and VECTRA ®. The preferred polymeric matrix is a thermoset resin selected from the group consisting of: epoxy, multifunctional epoxy, polyimide and cyanate esters.

The LCP fibres are preferably arranged in a nonwoven web. A further object of the present invention is a process for producing a fibre reinforcement adapted to be used in composite printed circuit boards, characterised by the following steps:
  a) melt blowing a liquid crystal polymer in order to form chopped fibres, and
  b) calendering the chopped fibres by means of heated rollers in order to obtain a local bonding of the fibres.

A web is therefore obtained without the use of any sizing agent which may adversely affect the integrity of electronic properties. In the meltblown process the molten polymer is forced through very fine holes in a special die into a high velocity airstream where the polymer is formed into very fine filaments of indeterminate lengths. Meltblown webs made of polypropylene, polyethylene, nylon and polyester are presently used for hospital gowns, sterile wrappings, incontinence devices, oil absorbers, battery separators, and special filters. This technology is not suited for the fibres presently used as reinforcement of printed circuit boards. By using the GRANLAR B fibres laminated with epoxy or cyanate ester resin the following properties may be obtained:
  structural integrity low dielectric constant
low coefficient of Thermal Expansion (CTE)
low moisture absorption
easy processing.

The low CTE allows one to avoid possible mismatches between the electronic components coupled to the PCB and the board itself.

The meltblown LCP nonwoven web produced by fibres which are formed into a sheet by calendering process is strong enough to adapt to conventional processing techniques.

LCP fibre webs obtained through the meltblown-calendering process have bonded fibres and a controlled smooth surface allowing the properties to be easier to predict, which makes it an ideal support for the PCB technology. Moreover with such a reinforcement the PCB may be easily mass-produced starting from a big "cracker" board, without the problem of cracking encountered with the woven fibre reinforcements.

The LCP web according to the invention demonstrates a lower expansion coefficient and lower dielectric constant enabling better prediction of properties and in particular allowing the PCB to be able to operate at significantly higher computing speed and reduce dramatically fatigue failure between the PCB and surface mounted devices.

In addition the LCP demonstrates a better rigidity with respect to nonwoven glass fibre, but still allows easy breaking and thus can be mass produced and so reduces process costs. Moreover the glass transition temperature (170° C.) of the preferred LCP (GRANLAR B) is high enough to pass critical high temperature SMT conditions.

The following table 1 points out the GRANLAR B fibre characteristic compared to the presently used fibre reinforcements.

TABLE 1

|  | Polyester | Glass | GRANLAR B | Aramid |
| --- | --- | --- | --- | --- |
| Tenacity (g/de) | 6 | 10 | 16 | 20 |
| Modulus (g/de) | 100 | 200 | 250 | 450 |
| Breaking Elongation (%) | 30 | 2 | 6 | 4 |
| Specific Gravity (g/cm$^3$) | 1.38 | 2.5 | 1.26 | 1.44 |
| Melting Point (°C.) | 256 | 1065 | 340 | na |
| Dielectric Constant (1 MHz) | 3.2 | 6.1 | 3.27 | 3.8 |
| Dissipation factor (1 Mhz) | no data available | $2 \cdot 10^{-3}$ | $1.1 \cdot 10^{-1}$ | $2.4 \cdot 10^{-1}$ |
| CTE (ppm/°C.) | 59.4 | 5 | 0 | 0.54 |

The following table 2 reports є comparison between the coefficient of thermal expansion (CTE) and dielectric constant (DK) of two composite substrates according to the present invention (having a fibre reinforcement made of GRANLAR B and a polymer matrix made of cyanate ester —C.E. —and epoxy resin respectively) and of five other known composite structure.

TABLE 2

| FIBER/POLYMER MATRIX | CTE (PPM/°C.) | DK |
| --- | --- | --- |
| LCP/CYANATE ESTER | 6 | 3.0 |
| LCP/EPOXY RESIN | 7 | 3.6 |
| ARAMID/CYANATE ESTER | 5 | 3.3 |
| ARAMID/EPOXY | 6 | 3.8 |
| GLASS/CYANATE ESTER | 12 | 3.8 |
| GLASS/POLYIMIDE | 12 | 3.8 |

TABLE 2-continued

| FIBER/POLYMER MATRIX | CTE (PPM/°C.) | DK |
| --- | --- | --- |
| FR-4[1] | 14 | 4.8 |

[1]FR-4: composite substrate constructed on multiple plies of epoxy resin impregnated woven glass cloth (as defined by NEMA - National Electrical Manufacturers Association in USA)

EXAMPLE

A GRANLAR B polymer, composed of units derived from terephthalic acid, and units derived from a mixture of 2-(alpha phenyl isopropyl) hydroquinone and (1-phenyl ethyl) hydroquinone in a molar ratio of 1.1, was fed to a single screw extruder made by Standridge Corporation GA, USA. The extruder data were as follows:

Extruder diameter: 2.54 cm (1 in)
L/D: 30
Screw speed: 22 rpm
Melt pressure before screen pack: 24 bar (350 psi)
Melt pressure after screen pack: 14 bar (210 psi)
Barrel temperature (constant): 329° C. (625° F.)

A die with 121 holes and heated at 329° C. (625° F.) was used. The hole diameter for each nozzle was 0.38 mm (0.015 in.), with L/D=10 (L: length; D: diameter).

The data for the system of air supplying to the die were as follows:

Air temperature: 363° C. (685° F.)
Holding tank pressure: 6 bar (85 psi)
Regulator pressure: 4.5 bar (65 psi)
Amount valve open: 35%
Air flow rate: 47.2 dm$^3$/s (100 ft$^3$/min)

The melt-blown fiber web was collected on a screen conveyor under the following "pick up" conditions:

Collector: 0.15 m/s (29 feet per min.)
Distance from die to collector: 7.6 cm (3 in.)
Output: 0.8 g/hole/min
Basis weight: 93 g/m$^2$ (2.5 oz/yd$^2$)
Web width: 15.2 cm (6 in.)

The web was then calendered into a nonwoven sheet under the following conditions:

Calender roll temperature: 120° C. (248° F.)
Calender roll width: 0.5 m (20 in.)
Calender roll pressure: 40 KN Three webs of calendered melt blown paper were then pressed together at 170° C. to form a final sheet. The sheet presented the following properties (which are compared with the properties of a nonwoven aramid paper tradenamed NOMEX ® (DU PONT) as a reference).

|  | Nomex[1] | GRANLAR B nonwoven paper |
| --- | --- | --- |
| Thickness mm (mils) | 0.25 (10) | 0.23 (9) |
| Basis weight g/m$^2$ (oz/yd$^2$) | 271 (7.3) | 219 (5.9) |
| Tens. strength bar (psi) | 12.4 (180) | 11.7 (170) |

[1]Trademark of E. I. du Pont de Nemcurs & Company (USA)

This sheet was then impregnated and made into a circuit board laminate using EPON 1151-BH-60 epoxy resin from the Shell Chemical Company in Houston, Tex. and QUATREX 5010 epoxy resin from the Dow Chemical Company in Midland, Mich. The impregnated sheet was then run through a heated chamber where solvent was driven off and the resin was partially cured into a "B" stage. This "B" stage resin and fiber matrix is commonly referred to as "prepreg". The resin content of the prepreg was between 60–70% by weight. The drying conditions were:

Entrance temperature: 80° C.
Exit temperature: 150° C.
Web travelling speed: 0.15 m/min (0.5 ft/min)
Chamber length: 3.05 m (10 feet)

A final circuit board laminate was made by stocking up 6 sheets of prepreg. Two 305 g/m² (1 oz/ft²) copper foils (supplied by Gould Inc., Cleveland, Ohio) were placed on the top and bottom of the six sheets. The built-up laminate was then pressed under heat and pressure. The press used was a 72 ton hydraulic press made by Accudyne Inc. California, USA. The lamination was carried out under the following conditions:

Press temperature: 175° C.
Time at temperature: 90 minutes
Pressure: 6.9 bar (100 psi)
Rate of rise: 14° C./min The resultant printed circuit board laminate had the following properties:

Thickness: 1.67 mm (66 mils)
Areal density: 2204 g/m² (65 oz/yd²)
Flexural strength: 758 bar (11.10³ psi)

The resultant laminate was also checked for drilling capability, drill hole appearance, platability and solderability. All four were seen to be acceptable.

A calculation of the dielectric constant for the resultant circuit board gives a value of 3.0 whereas a normal glass resin board gives a value of about 4.8, which is considered the norm for the industry.

We claim:

1. A composite printed circuit board substrate having a fibre reinforcement and a polymer matrix, wherein the fibre reinforcement comprises thermotropic melt processable liquid crystal polymer (LCP) fibres.

2. A substrate according to claim 1 wherein the fibres are made of a polyester type thermotropic liquid crystal polymer comprising:
   a) units derived from at least one aromatic or cycloaliphatic dicarboxy acid, and
   b) units derived from a mixture of at least two hydroquinones mono-substituted with aralkyl groups containing at least 7 carbons.

3. A substrate according to claim 2 where the fibers are made of a polyester thermotropic liquid crystal polymer comprising:
   a) units derived from terephthalic acid, and
   b) units derived from a mixture of (I) 2-(alpha phenyl isopropyl) hydroquinone and (II) (1-phenyl ethyl) hydroquinone, their molar ratio (II)/(I) being within the range of from 0.5 to 1.8.

4. A substrate according to claim 1 wherein the thermotropic melt processable LCP fibres are arranged in the form of a nonwoven fabric.

5. A substrate according to claim 1 wherein the polymeric matrix is a thermoset resin selected from the following groups, epoxy, multifunctional epoxy, polyimide, cyanate esters.

6. A printed circuit board comprising:
   a) a substrate sheet comprising reinforcement made of thermotropic melt processable LCP fibres and a thermoset resin, and
   b) at least one layer of metal laminated onto the substrate.

* * * * *